United States Patent
Yang et al.

(10) Patent No.: US 11,025,253 B2
(45) Date of Patent: Jun. 1, 2021

(54) OUTPUT STAGE CIRCUIT AND RELATED CONTROL METHOD

(71) Applicant: NOVATEK Microelectronics Corp., Hsin-Chu (TW)

(72) Inventors: Hsin-Hong Yang, Yunlin County (TW); Yen-Cheng Cheng, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 16/583,220

(22) Filed: Sep. 25, 2019

(65) Prior Publication Data

US 2020/0343892 A1   Oct. 29, 2020

Related U.S. Application Data

(60) Provisional application No. 62/838,942, filed on Apr. 26, 2019.

(51) Int. Cl.

| H03F 1/07 | (2006.01) |
|---|---|
| H03K 19/0185 | (2006.01) |
| H03F 1/02 | (2006.01) |
| H03K 17/687 | (2006.01) |
| H03F 3/45 | (2006.01) |

(52) U.S. Cl.
CPC ... *H03K 19/018514* (2013.01); *H03F 1/0205* (2013.01); *H03F 3/45179* (2013.01); *H03K 17/6871* (2013.01)

(58) Field of Classification Search
CPC .............................. H03F 1/07; H03F 1/0288
USPC ............................................. 330/124 R, 295
See application file for complete search history.

(56) References Cited

U.S. PATENT DOCUMENTS

| 7,432,922 | B2 | 10/2008 | Chang | |
|---|---|---|---|---|
| 7,982,535 | B2* | 7/2011 | Kim | H03F 3/45475 330/207 P |
| 8,811,920 | B2* | 8/2014 | Deuchars | H03F 1/0261 455/127.1 |
| 2007/0171169 | A1 | 7/2007 | Hirama | |
| 2011/0141098 | A1 | 6/2011 | Yaguma | |

* cited by examiner

*Primary Examiner* — Henry Choe
(74) *Attorney, Agent, or Firm* — Winston Hsu

(57) ABSTRACT

An output stage circuit includes a first operational amplifier, a second operational amplifier, a switch circuit, a clamp circuit and at least one pull-low transistor. The first operational amplifier is operated in a first voltage domain. The second operational amplifier is operated in a second voltage domain. The switch circuit is coupled to the first operational amplifier and the second operational amplifier. The clamp circuit is coupled between the switch circuit and a plurality of output terminals of the output stage circuit. The at least one pull-low transistor is coupled to the switch circuit.

18 Claims, 16 Drawing Sheets

OUTPUT STAGE CIRCUIT AND RELATED CONTROL METHOD

CROSS REFERENCE TO RELATED APPLICATIONS

This application claims the benefit of U.S. Provisional Application No. 62/838,942, filed on Apr. 26, 2019, the contents of which are incorporated herein by reference.

BACKGROUND OF THE INVENTION

1. Field of the Invention

The present invention relates to an output stage circuit and related control methods, and more particularly, to an output stage circuit implemented with mid-voltage devices and related control methods for performing power-on and power-off.

2. Description of the Prior Art

In a conventional source driver, the output stage circuit should be implemented with high-voltage devices, which have a high withstand voltage conforming to the output signals for driving the display panel. For example, the output signals may range between 0V and 10V, and thus the transistors in the output stage circuit have a withstand voltage approximately equal to 10V. However, the high-voltage devices have large area and high turned-on resistance, which increase the circuit costs and degrade the performance of the output stage circuit.

In order to reduce the circuit area and decrease the turned-on resistance of the output stage circuit, it is preferable to apply mid-voltage devices in the output stage circuit instead. However, the mid-voltage devices have insufficient withstand voltage which may not be enough to support the voltage range of output signals, especially during power on/off and polarity switching operations. A circuit device such as metal oxide semiconductor (MOS) transistor may easily break down if it receives a cross voltage higher than its withstand voltage. Thus, there is a need for improvement over the prior art.

SUMMARY OF THE INVENTION

It is therefore an objective of the present invention to provide an output stage circuit implemented with mid-voltage devices in order to prevent large circuit area and high turned-on resistance, while the overstress problem of the mid-voltage devices may be solved by using a well timing control scheme.

An embodiment of the present invention discloses an output stage circuit, which comprises a first operational amplifier, a second operational amplifier, a switch circuit, a clamp circuit and at least one pull-low transistor. The first operational amplifier is operated in a first voltage domain. The second operational amplifier is operated in a second voltage domain. The switch circuit is coupled to the first operational amplifier and the second operational amplifier. The clamp circuit is coupled between the switch circuit and a plurality of output terminals of the output stage circuit. The at least one pull-low transistor is coupled to the switch circuit.

Another embodiment of the present invention discloses a method of controlling an output stage circuit. The output stage circuit comprises a plurality of output terminals, a first operational amplifier operated in a first voltage domain, a second operational amplifier operated in a second voltage domain, a switch circuit, a clamp circuit, and at least one pull-low transistor. The method comprises the steps of: the at least one pull-low transistor pulling the plurality of output terminals to a first voltage; turning off the at least one pull-low transistor; adjusting a switch connection in the clamp circuit; the clamp circuit receiving a bulk control signal for switching a bulk voltage of the clamp circuit; and turning on a plurality of charge sharing transistors in the switch circuit to pull the plurality of output terminals to a second voltage different from the first voltage.

Another embodiment of the present invention discloses a method of controlling an output stage circuit. The output stage circuit comprises a plurality of output terminals, a first operational amplifier operated in a first voltage domain, a second operational amplifier operated in a second voltage domain, a switch circuit, a clamp circuit, and at least one pull-low transistor. The method comprises the steps of: a plurality of charge sharing transistors in the switch circuit pulling the plurality of output terminals to a first voltage; turning off the plurality of charge sharing transistors; adjusting a switch connection in the clamp circuit; the clamp circuit receiving a bulk control signal for switching a bulk voltage of the clamp circuit; and turning on the at least one pull-low transistor to pull the plurality of output terminals to a second voltage different from the first voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
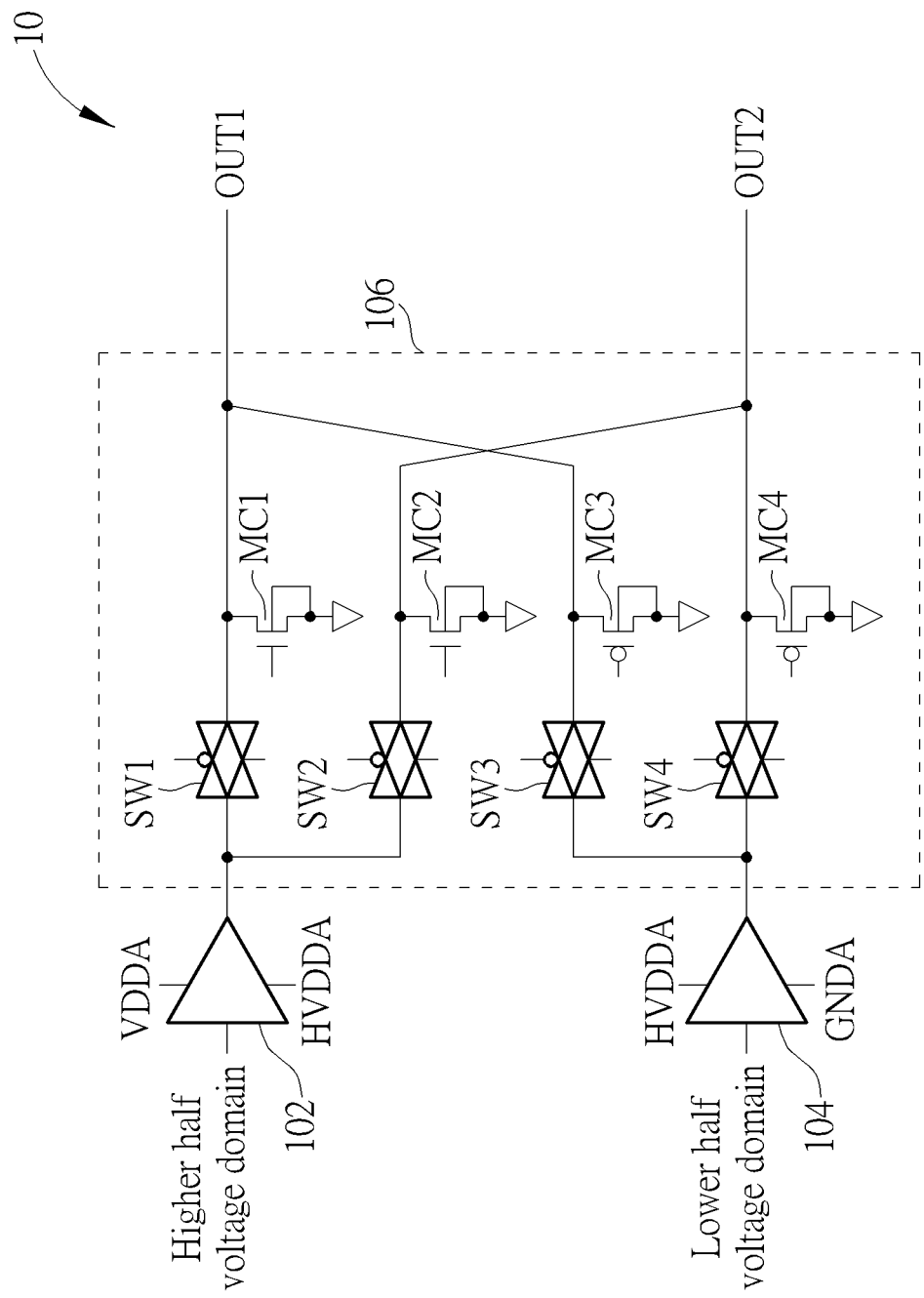
FIG. 1 is a schematic diagram of a general output stage circuit.

Please refer to FIG. 1, which is a schematic diagram of a general output stage circuit 10. As shown in FIG. 1, the output stage circuit 10 includes two operational amplifiers (OPs) 102 and 104, and a switch circuit 106. The output stage circuit 10 has two output terminals OUT1 and OUT2.

The OPs 102 and 104 are operated in a higher half voltage domain and a lower half voltage domain, respectively. In detail, the OP 102 receives a power supply voltage VDDA and a half power supply voltage HVDDA, and is thereby operated in a higher voltage domain between VDDA and HVDDA. The OP 104 receives the half power supply voltage HVDDA and a ground voltage GNDA, and is thereby operated in a lower voltage domain between HVDDA and GNDA. The switch circuit 106 includes a plurality of channels, each of which is configured to forward voltage signals from one of the OPs 102 and 104 to one of the output terminals OUT1 and OUT2. Therefore, 4 channels in the switch circuit 106 serve this purpose. In the switch circuit 106, each channel has a switch (SW1-SW4) and a charge sharing transistor (MC1-MC4).

In general, with reception of the half power supply voltage HVDDA, the operating voltage range of the OPs 102 and 104 may be equal to one half of the operating voltage range of the whole output stage circuit 10; hence, the mid-voltage devices are feasible to be implemented in the OPs 102 and 104. However, with the polarity inversion scheme, each of the output terminals OUT1 and OUT2 should be able to output voltage signals in a level between the highest voltage level (approximately equal to VDDA) and the lowest voltage level (approximately equal to GNDA). Therefore, each switch SW1-SW4 in the switch circuit 106 should be able to undergo a voltage stress up to VDDA minus GNDA. Also, when the panel is powered on or off, the output terminals OUT1 and OUT2 are requested to be pulled to the ground voltage or zero voltage. In such a situation, the switches SW1 and SW2 may still be confronted with a larger voltage stress if a higher voltage signal is received from the OP 102. Therefore, the transistors in the switch circuit 106 need to be implemented with high-voltage devices having a higher withstand voltage. If mid-voltage devices are applied in the switch circuit 106, the mid-voltage devices having insufficient withstand voltage may easily break down, especially during power-on/off and polarity inversion.

Figure 2:
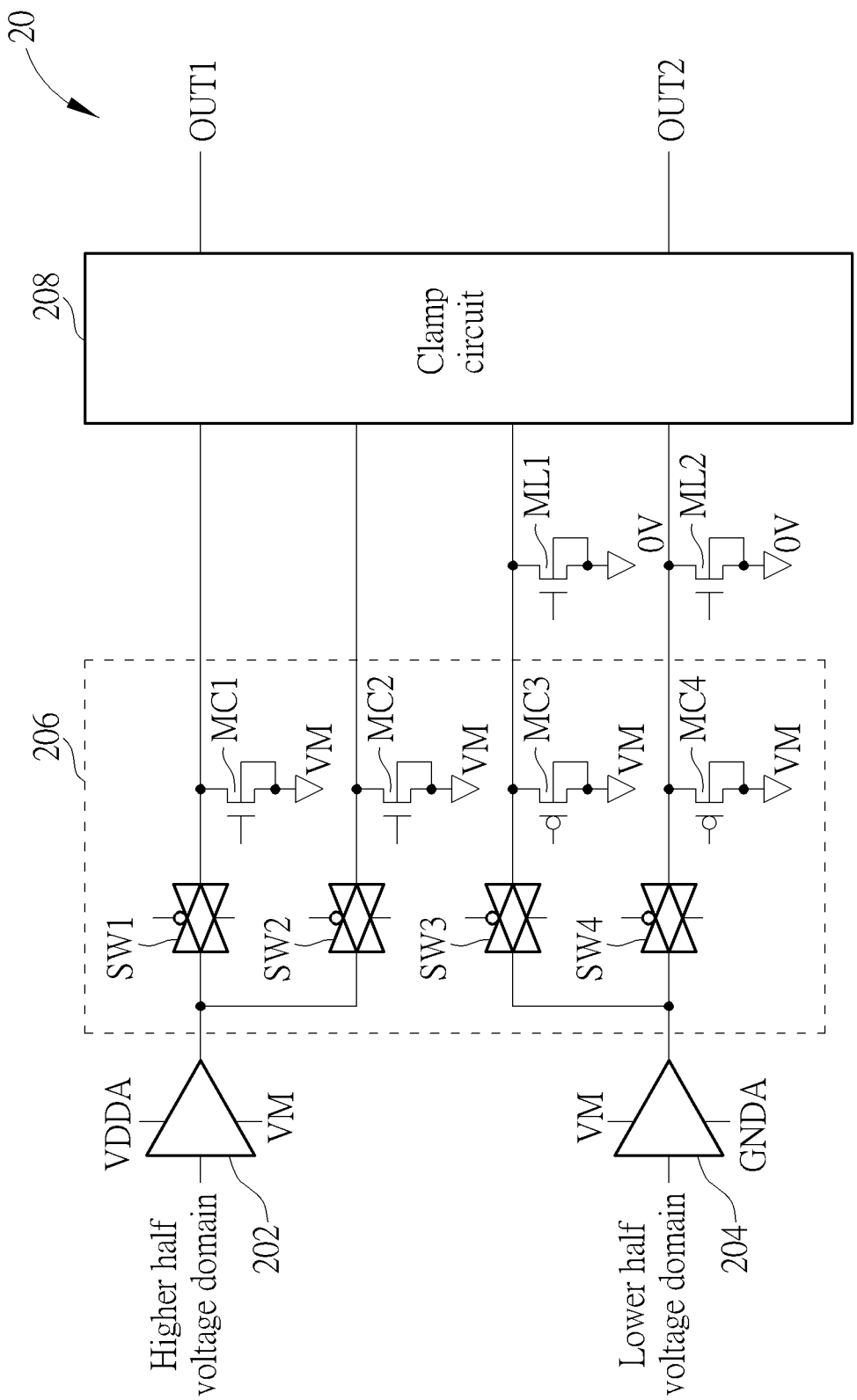
FIG. 2 is a schematic diagram of an output stage circuit according to an embodiment of the present invention.

Please refer to FIG. 2, which is a schematic diagram of an output stage circuit 20 according to an embodiment of the present invention. As shown in FIG. 2, the output stage circuit 20 includes two OPs 202 and 204, a switch circuit 206, a clamp circuit 208 and pull-low transistors ML1-ML2. The OPs 202 and 204 are operated in a higher half voltage domain and a lower half voltage domain, respectively, based on the received supply voltages, as similar to the OPs 102 and 104 shown in FIG. 1. In the output stage circuit 20, the power supply voltage VDDA and the middle voltage VM allow the OP 202 to be operated in a higher voltage domain, and the middle voltage VM and the ground voltage GNDA allow the OP 204 to be operated in a lower voltage domain. The middle voltage VM may be equal to or close to a half of the power supply voltage VDDA. In an embodiment, the power supply voltage VDDA may be equal to 10V and the ground voltage GNDA may be equal to 0V, and thus the middle voltage VM may be equal to 5V. The mid-voltage devices with a withstand voltage equal to 5V are feasible in the OPs 202 and 204 since the operating voltage range of the OPs 202 and 204 is equal to 5V.

Similar to the output stage circuit 10 shown in FIG. 1, the output stage circuit 20 includes the switch circuit 206 having a structure similar to the structure of the switch circuit 106. In detail, the switch circuit 206 is coupled to the OPs 202 and 204, and includes switches SW1-SW4 and charge sharing transistors MC1-MC4. Each switch SW1-SW4 may be turned on or off to control a voltage signal from the OP 202 or 204 to be forwarded to one of the output terminals OUT1 and OUT2. The charge sharing transistors MC1-MC4, which are coupled to a middle voltage source supplying the middle voltage VM (which may be equal to or close to the middle voltage VM supplied to the OPs 202 and 204), are configured to perform charge sharing by pulling the output terminals OUT1 and OUT2 to the middle voltage VM, e.g., 5V. The charge sharing operation pulls the output terminals OUT1 and OUT2 to the middle voltage VM, so that the output terminals OUT1 and OUT2 may reach their target voltages more rapidly from the middle voltage VM when the output data signal arrives, especially when a polarity inversion scheme is applied.

Please note that the output stage circuit 20 may be implemented in a source driver for outputting voltage signals to data lines on a panel. The structure of the switch circuit 206 and the output stage circuit 20 aims at realizing polarity inversion; that is, each output terminal OUT1 and OUT2 may selectively output voltage signals in different polarities, by receiving output signals from the OP 202 or 204. The output stage circuit 20 is served to provide voltage signals for two channels of the panel, and the source driver may include multiple similar output stage circuits served to provide voltage signals for the entire panel.

In the output stage circuit 20 of the present invention, in order to prevent large circuit area and high turned-on resistance, the mid-voltage devices may be applied instead of the high-voltage devices. In other words, transistors having the same withstand voltage are implemented in the OPs 202 and 204 and also in the switch circuit 206 and the clamp circuit 208. The pull-low transistors ML1 and ML2 are also implemented with transistors having the same withstand voltage as other modules. In order to prevent the overstress problem that may appear on the mid-voltage devices, the clamp circuit 208 is included and disposed between the switch circuit 206 and the output terminals OUT1 and OUT2 of the output stage circuit 20. The pull-low transistors ML1 and ML2, which are disposed to be coupled between the switch circuit 206 and the clamp circuit 208, are configured to pull the output terminals OUT1 and OUT2 to the ground voltage or zero voltage. It should be noted that the charge sharing transistors may pull the output terminals OUT1 and OUT2 to the middle voltage, e.g., 5V, when charge sharing is performed, while the pull-low transistors ML1 and ML2 may be turned on to pull the output terminals OUT1 and OUT2 to a ground level when the panel is powered on or off. That is, the pull-low transistors ML1 and ML2 and the charge sharing transistors MC1-MC4 pull the output terminals OUT1 and OUT2 to different voltage levels.

In general, after the panel is powered on and when the image data signals are not received yet, it is preferable to pull the output terminals OUT1 and OUT2 to the zero voltage (via the pull-low transistors ML1 and ML2), to be identical to the common voltage of the panel. This allows the pixel voltages of the panel to be zero and thereby prevents unwanted flicker appearing on the screen. Similar pull-low operation is performed when the panel finishes reception of image signals before the panel is powered off.

Figure 3:
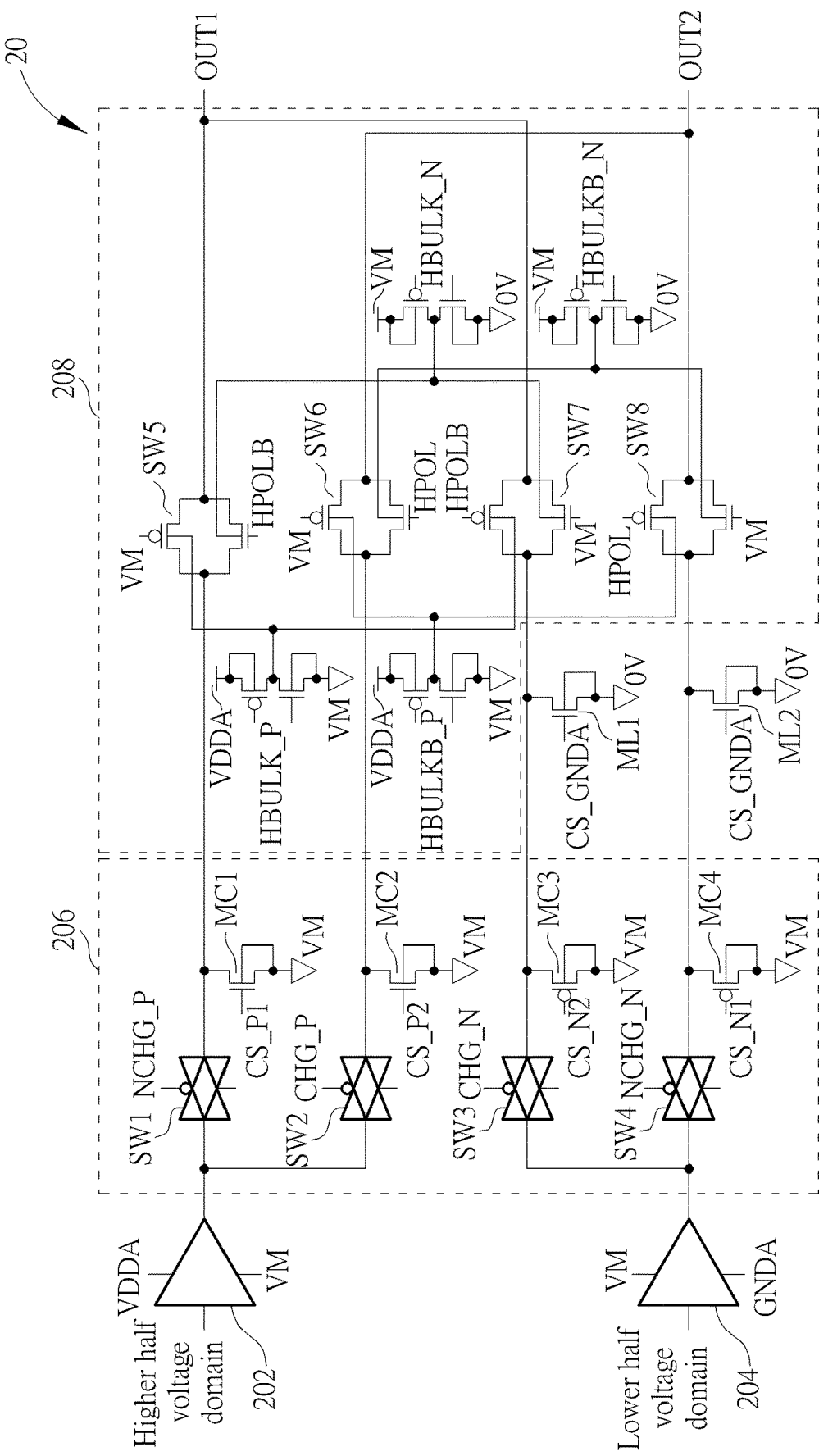
FIG. 3 illustrates an implementation of the output stage circuit with a detailed structure of the clamp circuit.

FIG. 3 illustrates an implementation of the output stage circuit 20 with a detailed structure of the clamp circuit 208. In detail, the clamp circuit 208 includes 4 channels corresponding to the 4 channels of the switch circuit 206, and each channel of the clamp circuit 208 includes a switch (SW5-SW8) implemented as a transmission gate. The switches SW5-SW8 receive control signals HPOL and HPOLB to be turned on or off, allowing each of the output terminals OUT1 and OUT2 to receive voltage signals from the OP 202 or 204 via the switch circuit 206, so as to realize polarity inversion. The switches SW5-SW8 in the clamp circuit 208 further receive bulk control signals HBULK_P, HBULKB_P, HBULK_N and HBULKB_N, which switch the bulk voltages of the transistors in the switches SW5-SW8. With well control of the bulk control signals HBULK_P, HBULKB_P, HBULK_N and HBULKB_N, the clamp circuit 208 may be immune to the overstress problem with the usage of mid-voltage devices as the switch transistors. In addition, the switches SW1-SW4 in the switch circuit 206, which are also implemented as transmission gates, are controlled by control signals NCHG_P, CHG_P, CHG_N and NCHG_N, respectively. Further, in the switch circuit 206, the charge sharing transistors MC1 and MC2 are N-type metal oxide semiconductor (NMOS) transistors controlled by control signals CS_P1 and CS_P2, respectively, and the charge sharing transistors MC3 and MC4 are P-type metal oxide semiconductor (PMOS) transistors controlled by control signals CS_N2 and CS_N1, respectively. The pull-low transistors ML1 and ML2 are controlled by a common control signal CS_GNDA. As mentioned above, the charge sharing transistors MC1-MC4 couple the output terminals OUT1 and OUT2 to a middle voltage source to receive the middle voltage VM, e.g., 5V, to perform charge sharing. The pull-low transistors ML1 and ML2, which are NMOS transistors, couple the output terminals OUT1 and OUT2 to a ground terminal, in order to pull low the output terminals OUT1 and OUT2 when the panel is powered on or off.

In the output stage circuit 20 as shown in FIG. 3, the OPs 202 and 204 are operated in half voltage domain (e.g., 5V-10V or 0V-5V), and are easily implemented with mid-voltage devices having a withstand voltage equal to 5V. The switch circuit 206 and the clamp circuit 208 are configured to forward voltage signals up to approximately VDDA (e.g., 10V) and down to approximately GNDA (e.g., 0V); hence, if the switch circuit 206 and the clamp circuit 208 are implemented with the mid-voltage devices, a timing control mechanism should be applied to prevent the overstress problem.

Figure 4:
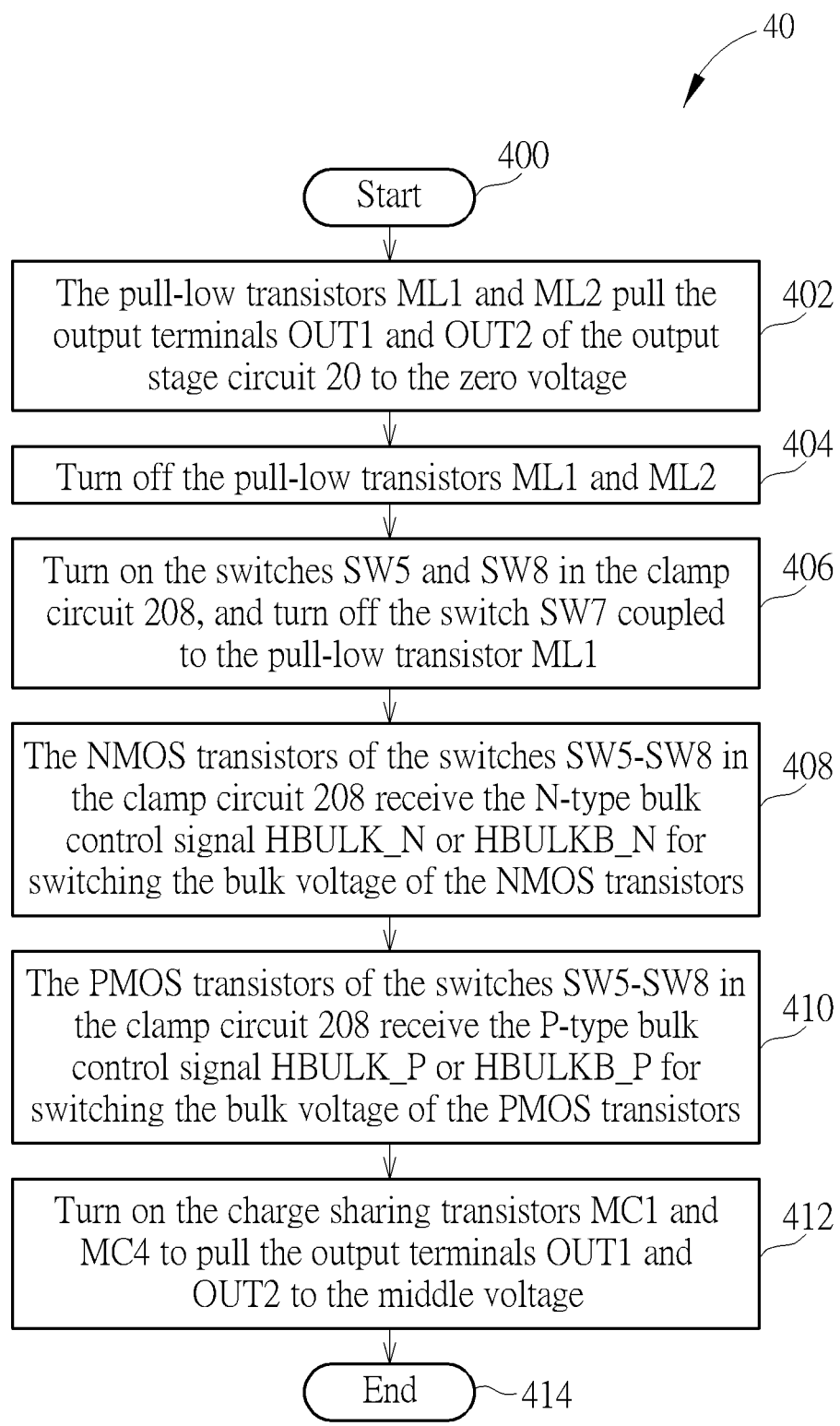
FIG. 4 is a flowchart of a control process according to an embodiment of the present invention.

Please refer to FIG. 4, which is a flowchart of a control process 40 according to an embodiment of the present invention. The control process 40 may be implemented in an output stage circuit such as the output stage circuit 20, which includes two OPs 202 and 204 operated in different voltage domains, the switch circuit 206, the clamp circuit 208, and the pull-low transistors ML1 and ML2, for controlling a power-on operation for driving a panel coupled to the output stage circuit. As shown in FIG. 4, the control process 40 includes the following steps:

Step 400: Start.

Step 402: The pull-low transistors ML1 and ML2 pull the output terminals OUT1 and OUT2 of the output stage circuit 20 to the zero voltage.

Step 404: Turn off the pull-low transistors ML1 and ML2.

Step 406: Turn on the switches SW5 and SW8 in the clamp circuit 208, and turn off the switch SW7 coupled to the pull-low transistor ML1.

Step 408: The NMOS transistors of the switches SW5-SW8 in the clamp circuit 208 receive the N-type bulk control signal HBULK_N or HBULKB_N for switching the bulk voltage of the NMOS transistors.

Step 410: The PMOS transistors of the switches SW5-SW8 in the clamp circuit 208 receive the P-type bulk control signal HBULK_P or HBULKB_P for switching the bulk voltage of the PMOS transistors.

Step 412: Turn on the charge sharing transistors MC1 and MC4 to pull the output terminals OUT1 and OUT2 to the middle voltage.

Step 414: End.

Figure 5A:
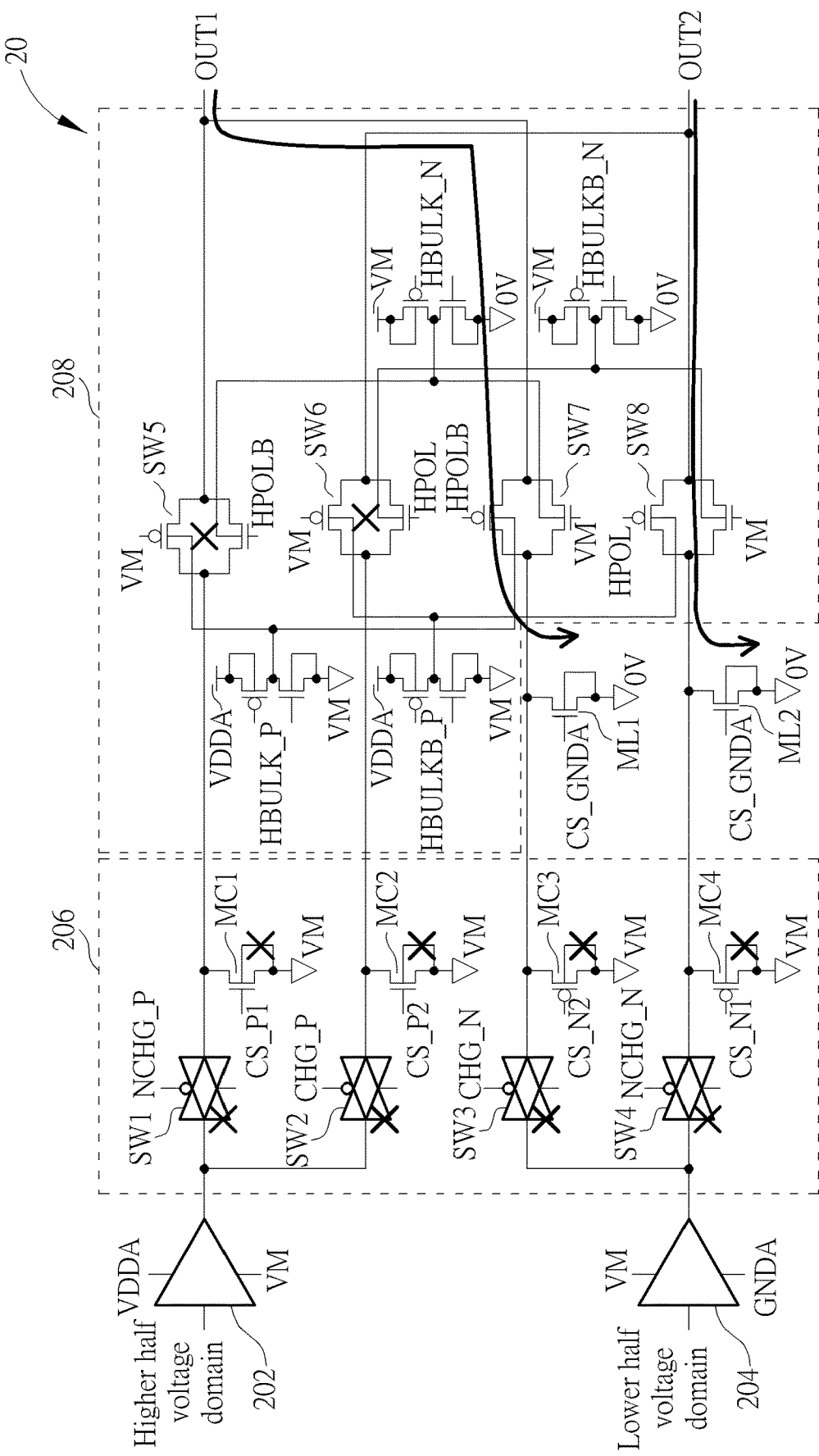
FIGS. 5A-5D are schematic diagrams of the output stage circuit being controlled with the control process shown in FIG. 4.

According to the control process 40, the output terminals OUT1 and OUT2 may be pulled to the zero voltage or ground voltage after the panel is powered on (Step 402), so as to prevent unwanted flicker appearing on the screen. As shown in FIG. 5A, the pull-low transistors ML1 and ML2 are turned on to pull the output terminals OUT1 and OUT2 to the zero voltage, respectively. Also, the switches SW7 and SW8 coupled between the pull-low transistors ML1 and ML2 and the output terminals OUT1 and OUT2 are turned on. In this step, other switches and charge sharing transistors may be turned off to prevent unnecessary leakage currents. The turned-off transistors are marked with cross symbols.

Figure 5B:
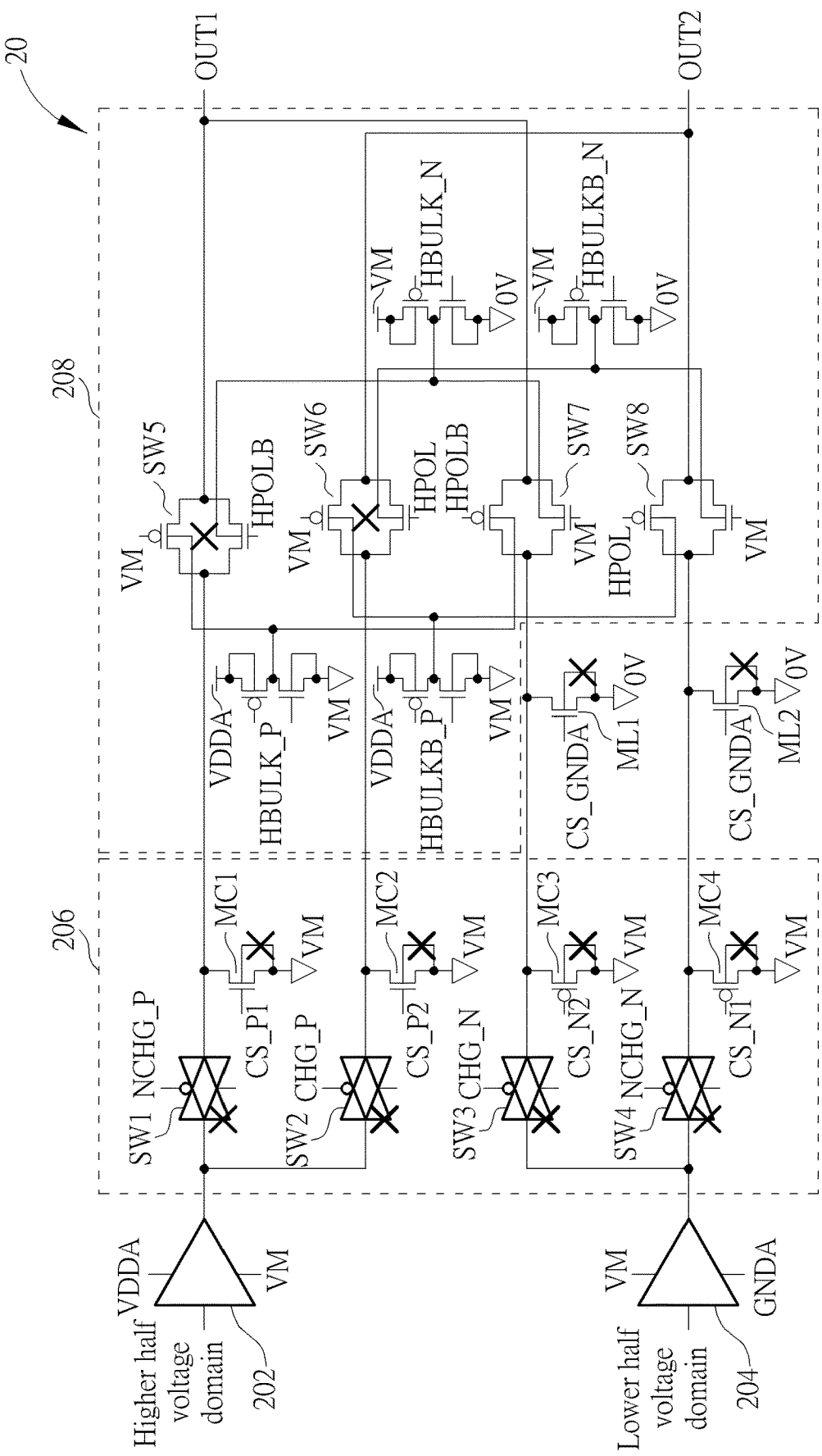
Figure 5C:
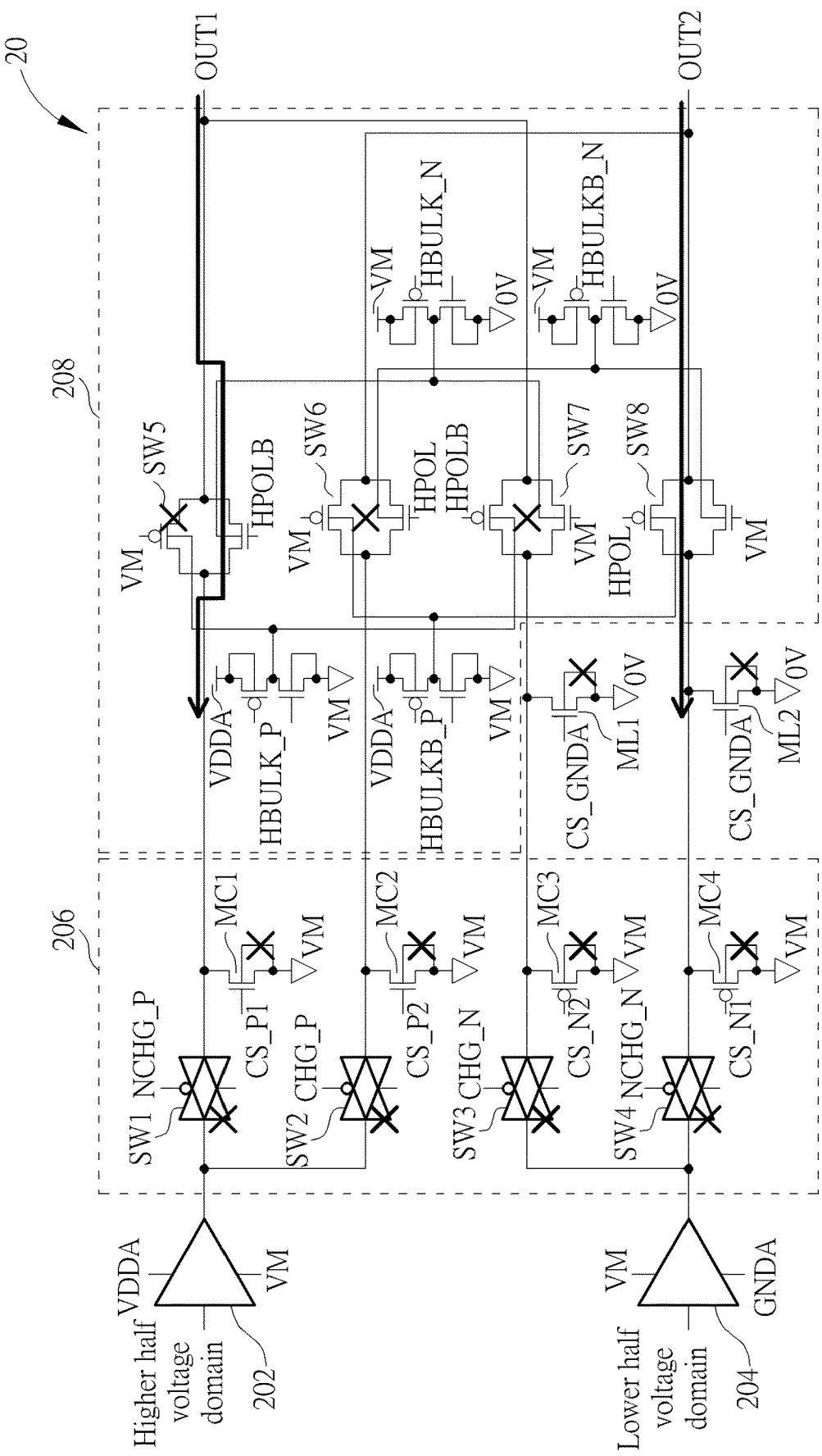

Subsequently, the control signal CS_GNDA turns off the pull-low transistors ML1 and ML2 to stop the pull-low operation (Step 404). In such a situation, the connections between the output terminals OUT1 and OUT2 and the ground terminal are cut off, as shown in FIG. 5B. In order to be ready for follow-up normal operations, the output terminals OUT1 and OUT2 may undergo charge sharing to reach the middle voltage or half voltage, e.g., 5V. Therefore, the switch connection in the clamp circuit 208 should be adjusted correspondingly. In this embodiment, the charge sharing operation is performed via the charge sharing transistors MC1 and MC4; hence, the corresponding switches SW5 and SW8 in the clamp circuit 208 are turned on, while the switch SW7 is turned off (Step 406), and the switch SW6 is off originally. This switch connection configuration may be realized by pulling the control signal HPOLB from the zero voltage to the middle voltage VM, as shown in FIG. 5C. Note that the control signal HPOLB may not be pulled to a high voltage such as the power supply voltage VDDA in this step. If the control signal HPOLB reaches a higher voltage level, the clamp circuit 208 may be confronted with the overstress problem due to excessive cross voltage on the gate-to-source and gate-to-bulk terminals.

After the switch connection in the clamp circuit 208 is ready for charge sharing, the bulk configuration in the clamp circuit 208 may also be adjusted. The bulk control signals HBULK_P, HBULKB_P, HBULK_N and HBULKB_N received by the clamp circuit 208 may be switched to change the bulk voltage of the switches SW5-SW8. In this embodiment, the N-type bulk control signal HBULK_N received by the NMOS transistors of the switches SW5 and SW7 changes its state to switch the bulk voltage of the NMOS transistors of the switches SW5 and SW7 (Step 408). The bulk voltage is switched from a lower voltage level (e.g., the zero voltage) to the middle voltage VM. After the bulk voltage of the NMOS transistors is switched, the P-type bulk control signal HBULK_P received by the PMOS transistors of the switches SW5 and SW7 changes its state to switch the bulk voltage of the PMOS transistors of the switches SW5 and SW7 (Step 410). The bulk voltage is switched from the middle voltage VM to a higher voltage level (e.g., the power supply voltage VDDA).

As mentioned above, the transistors of the switches SW5-SW8 in the clamp circuit 208 are mid-voltage devices with a medium withstand voltage. For example, the withstand voltage of the mid-voltage devices may be equal to the middle voltage, 5V, while the bulk voltage of the PMOS transistors may reach the power supply voltage VDDA, 10V. In order to prevent the overstress problem, it is preferable to switch the bulk voltage of NMOS transistors from 0V to 5V before the bulk voltage of PMOS transistors is switched from 5V to 10V; otherwise, a cross voltage equal to 10V may appear between the P-well and N-well, resulting in breakdown easily.

Please note that, since the transistors in the clamp circuit 208 have variable bulk voltages, these transistors may not share the P-well and N-well with other transistors in the output stage circuit 20. In other words, the P-well and N-well of these transistors should be disposed independently. In order to save circuit area, the P-well and N-well of transistors of the same transmission gate are usually disposed together, which forms a P-N junction between the wells. In the control process of the present invention, the NMOS bulk voltage is switched (from 0V to 5V) before the PMOS bulk voltage (from 5V to 10V); this prevents a cross voltage 10V appearing on the P-N junction and thereby prevents breakdown of the transistors.

In a general output stage circuit such as the output stage circuit 10 shown in FIG. 1, the high-voltage devices are applied, and there is no clamp circuit included. Therefore, all transistors implemented with the high-voltage devices may share the same P-well and N-well. In comparison, in the output stage circuit 20 of the present invention, the mid-voltage devices are applied to replace the high voltage devices, and thus the clamp circuit 208 is disposed, to clamp the cross voltage and prevent the overstress problem. There are transistors having independent P-well and N-well in the clamp circuit 208, and these transistors may be disposed differently and may be distinguishable in the circuit layout.

Figure 5D:
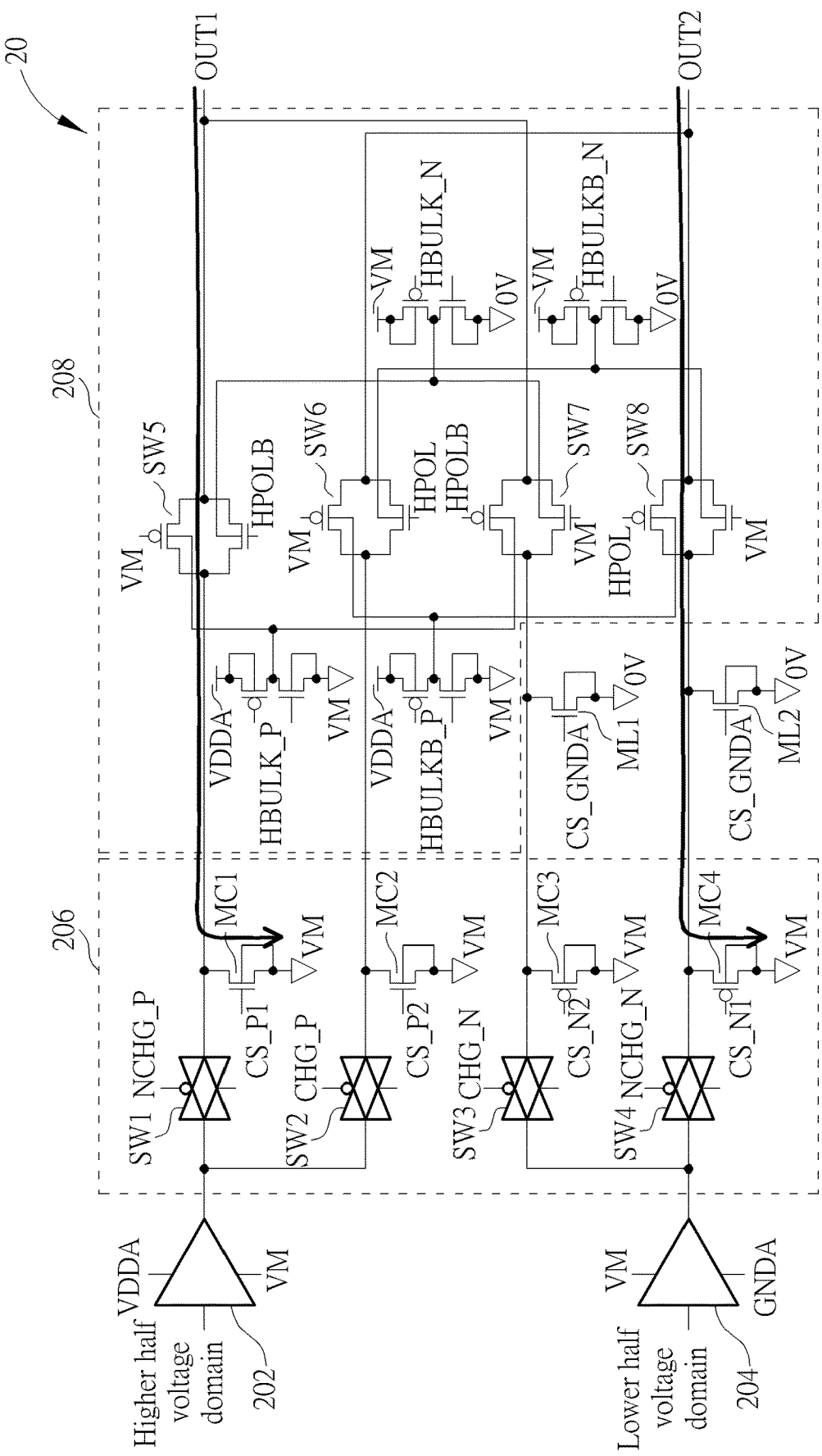

After the bulk switching is complete, the control signals CS_P1 and CS_N1 may turn on the corresponding charge sharing transistors MC1 and MC4, respectively, to pull the output terminals OUT1 and OUT2 to the middle voltage (Step 412), as shown in FIG. 5D. Therefore, the power-on operations, from pull-low to mid-voltage charge sharing, may be complete, and the control signals in the output stage circuit 20 are well controlled and switched in a specific order to prevent the overstress problem. Subsequently, the control signal HPOLB may be switched from the middle voltage VM to a high voltage level such as 10V, so that the output stage circuit 20 is ready for follow-up normal operations.

Figure 6:
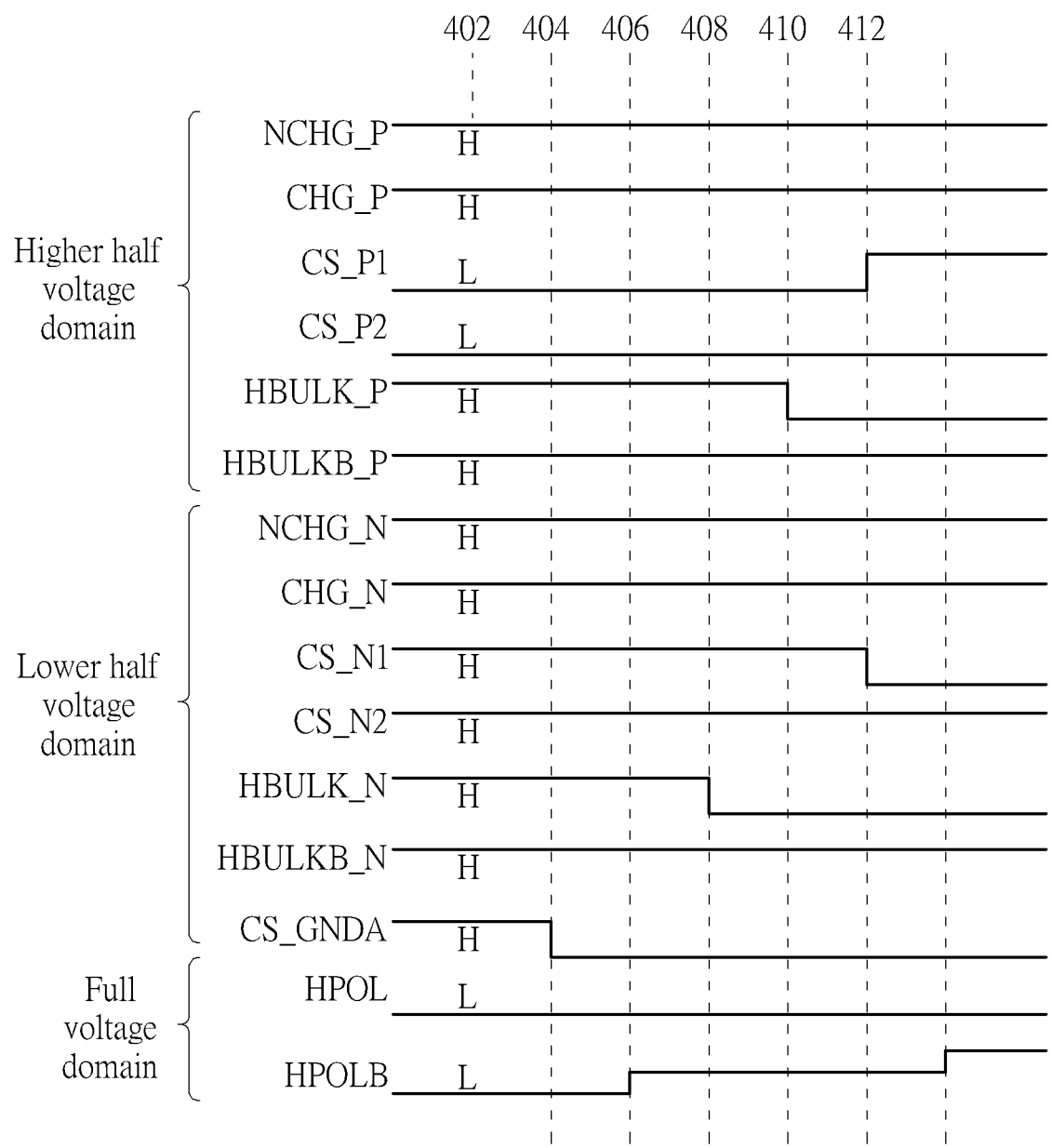
FIG. 6 is a waveform diagram of related control signals for the output stage circuit based on the control process shown in FIG. 4.

FIG. 6 illustrates the waveforms of related control signals for the output stage circuit 20 based on the control process 40. The control signals HPOL and HPOLB for the clamp circuit 208 are operated in the full voltage domain, and other control signals are operated in the higher half voltage domain or the lower half voltage domain. In an embodiment, the higher half voltage domain ranges from 5V to 10V, the lower half voltage domain ranges from 0V to 5V, and the full voltage domain ranges from 0V to 10V.

Please note that the present invention provides not only the control process for power-on operation of the panel, but also the control process for power-off operation of the panel, as described below.

Figure 7:
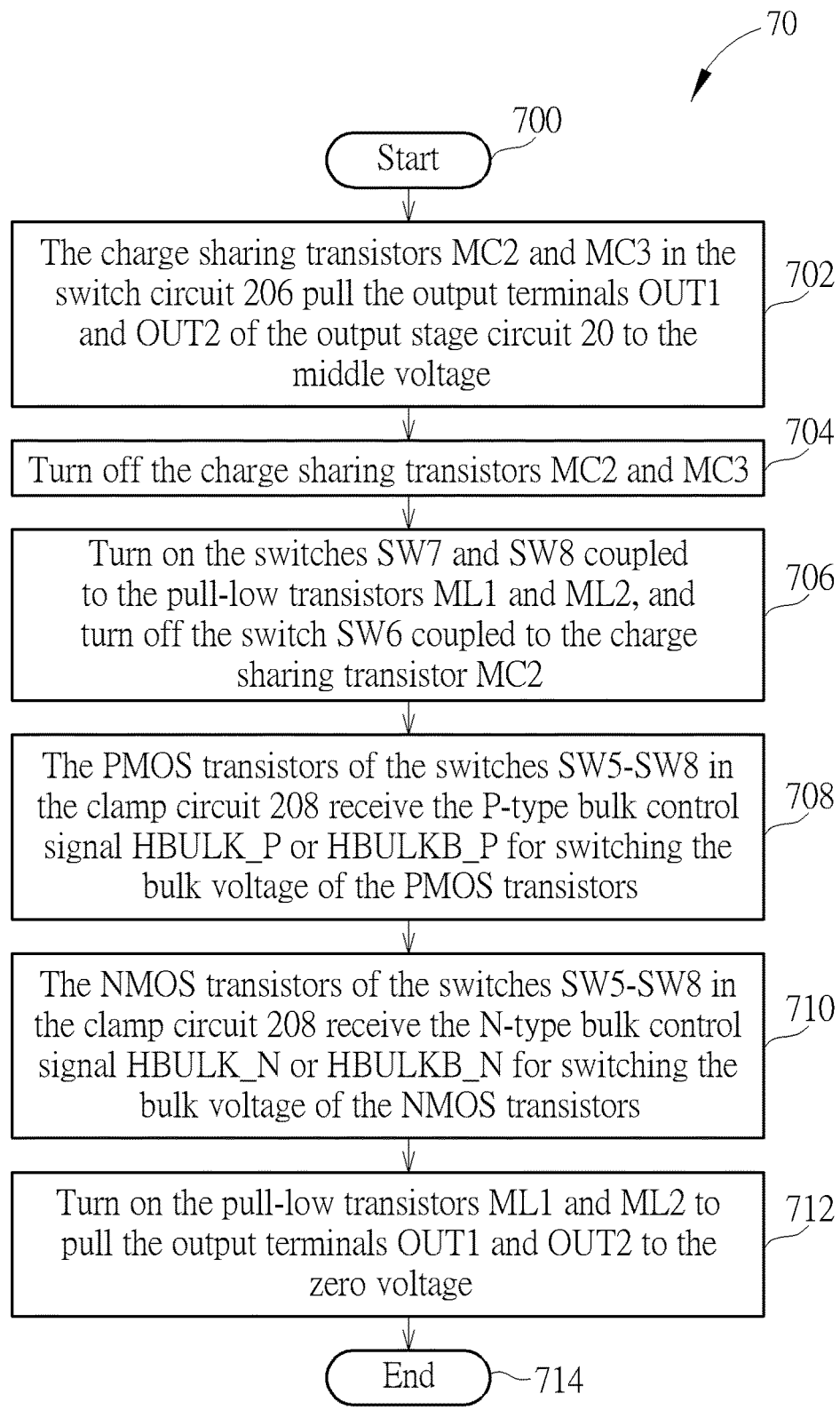
FIG. 7 is a flowchart of a control process according to an embodiment of the present invention.

Please refer to FIG. 7, which is a flowchart of a control process 70 according to an embodiment of the present invention. The control process 70 may be implemented in an output stage circuit such as the output stage circuit 20, which includes two OPs 202 and 204 operated in different voltage domains, the switch circuit 206, the clamp circuit 208, and the pull-low transistors ML1 and ML2, for controlling a power-off operation for driving a panel coupled to the output stage circuit. As shown in FIG. 7, the control process 70 includes the following steps:

Step 700: Start.

Step 702: The charge sharing transistors MC2 and MC3 in the switch circuit 206 pull the output terminals OUT1 and OUT2 of the output stage circuit 20 to the middle voltage.

Step 704: Turnoff the charge sharing transistors MC2 and MC3.

Step 706: Turn on the switches SW7 and SW8 coupled to the pull-low transistors ML1 and ML2, and turn off the switch SW6 coupled to the charge sharing transistor MC2.

Step 708: The PMOS transistors of the switches SW5-SW8 in the clamp circuit 208 receive the P-type bulk control signal HBULK_P or HBULKB_P for switching the bulk voltage of the PMOS transistors.

Step 710: The NMOS transistors of the switches SW5-SW8 in the clamp circuit 208 receive the N-type bulk control signal HBULK_N or HBULKB_N for switching the bulk voltage of the NMOS transistors.

Step 712: Turn on the pull-low transistors ML1 and ML2 to pull the output terminals OUT1 and OUT2 to the zero voltage.

Step 714: End.

According to the control process 70, the power-off process may start from a charge sharing state, wherein the output terminals OUT1 and OUT2 are pulled to the middle voltage VM via the charge sharing transistors MC2 and MC3 (Step 702). In this embodiment, the output stage circuit 20 may be operated in a polarity inversion mode, and thus the output terminals OUT1 and OUT2 are coupled to the middle voltage source via the charge sharing transistors MC3 and MC2, respectively. This is different from a polarity non-inversion mode where charge sharing is performed via the charge sharing transistors MC1 and MC4. In addition, the switches SW6 and SW7 coupled between the charge sharing transistors MC2 and MC3 and the output terminals OUT1 and OUT2 are turned on. In this step, other switches and charge sharing transistors may be turned off to prevent unnecessary leakage currents. The turned-off transistors are marked with cross symbols.

Figure 8A:
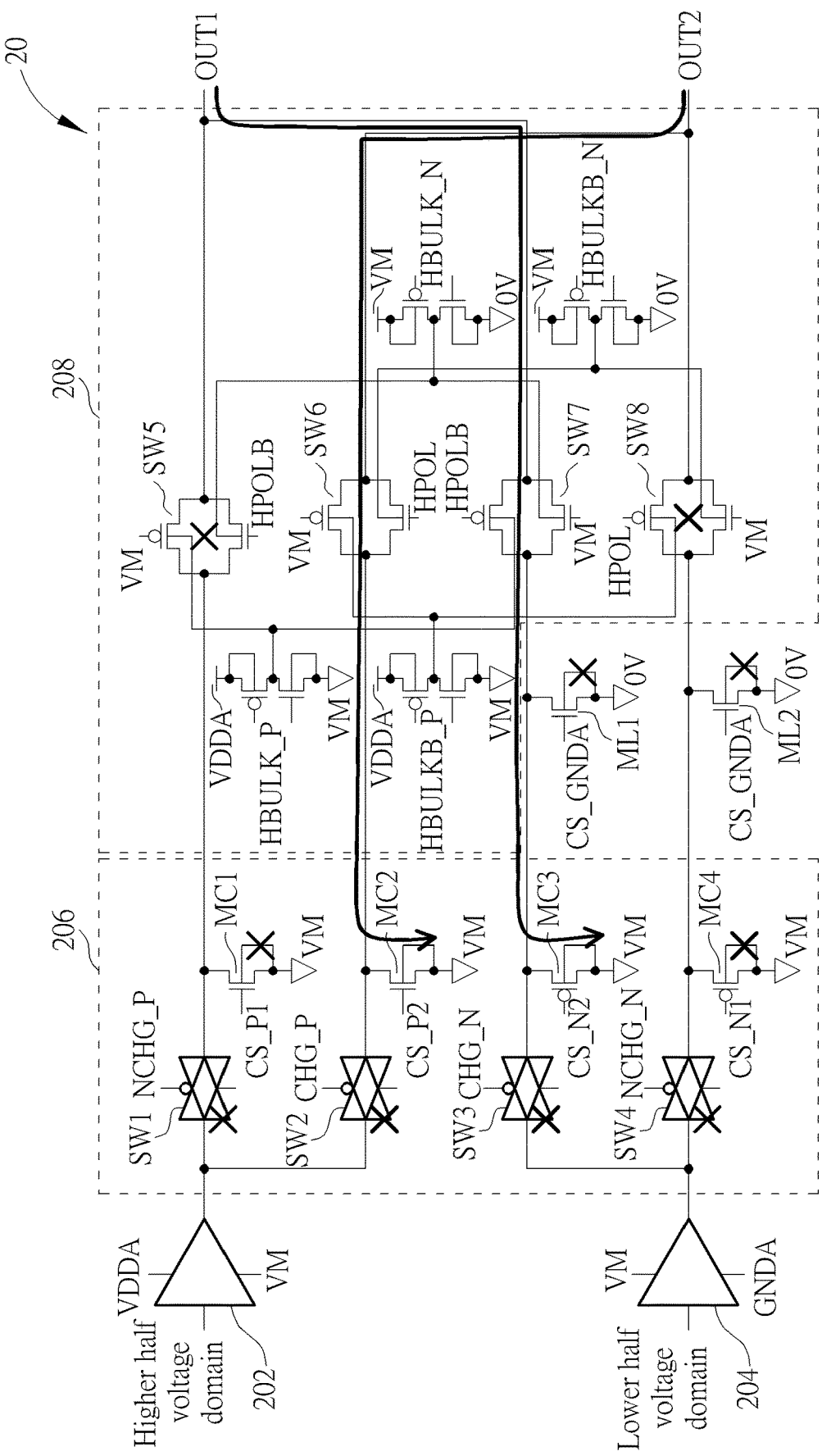
FIGS. 8A-8D are schematic diagrams of the output stage circuit being controlled with the control process shown in FIG. 7.
Figure 8B:
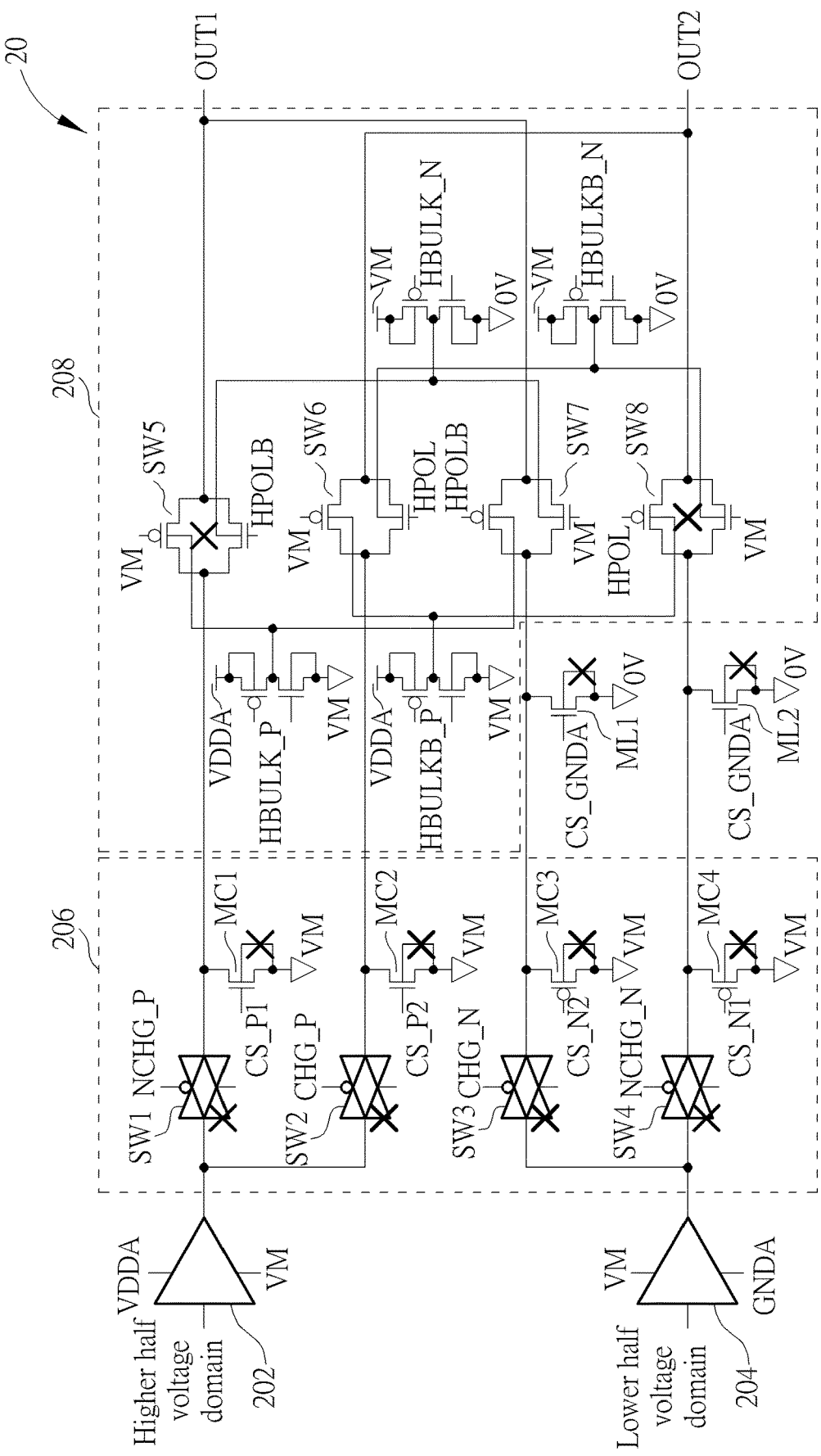
Figure 8C:
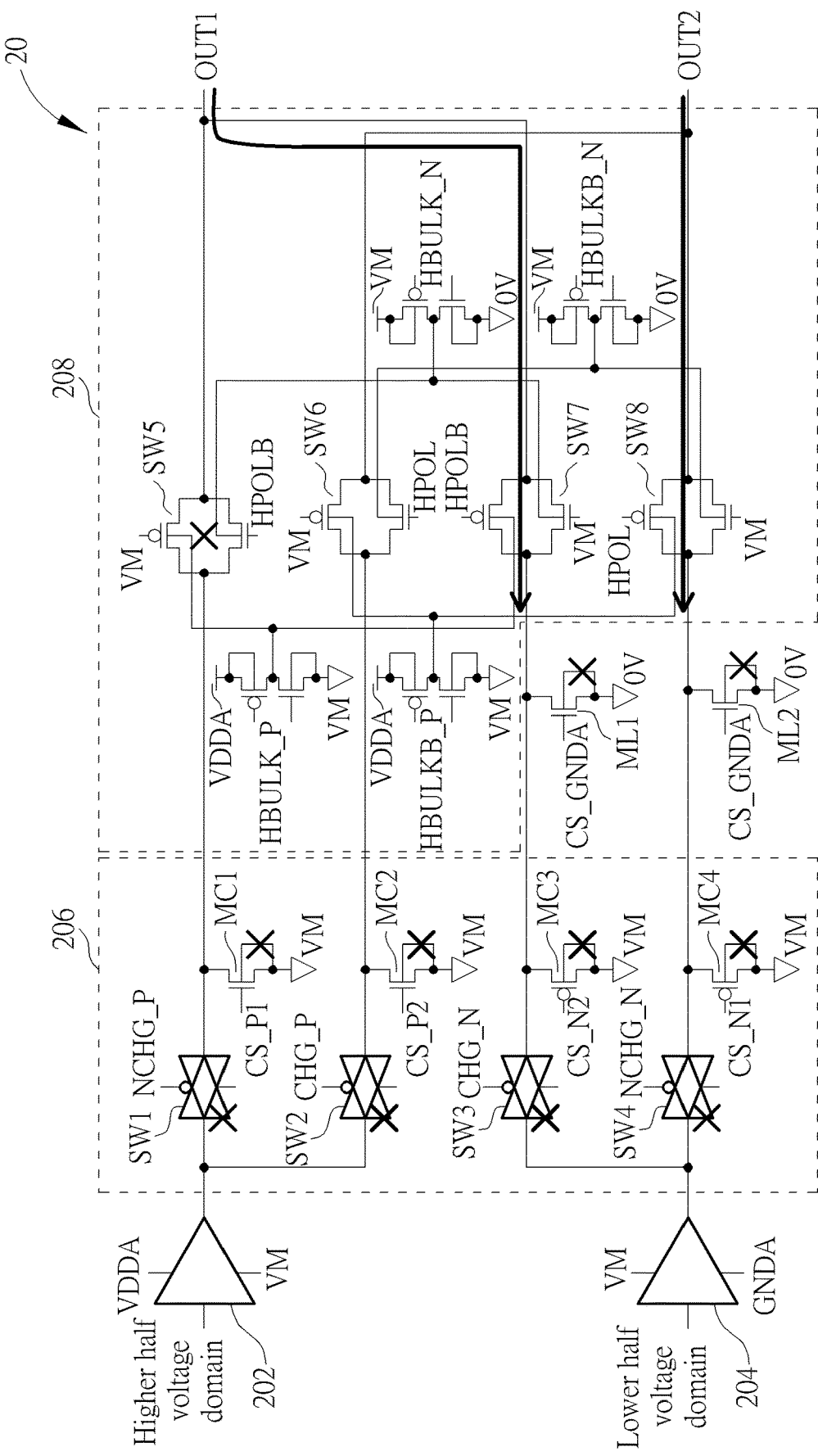

Subsequently, the control signals CS_P2 and CS_N2 turnoff the charge sharing transistors MC2 and MC3 to stop the charge sharing operation (Step 704). In such a situation, the connections between the output terminals OUT1 and OUT2 and the middle voltage source are cut off, as shown in FIG. 8B. In order to be ready for follow-up pull-low operations, the switch connection in the clamp circuit 208 should be adjusted correspondingly. Since the pull-low transistors ML1 and ML2 are coupled to the channels corresponding to the lower voltage domain, the corresponding switches SW7 and SW8 in the clamp circuit 208 are turned on, while the switch SW6 is turned off (Step 706), and the switch SW5 is off originally. This switch connection configuration may be realized by pulling the control signal HPOL from the high voltage (e.g., VDDA) to the middle voltage VM, as shown in FIG. 8C. Note that the control signal HPOL may not be pulled to a low voltage such as the zero voltage in this step. If the control signal HPOL reaches a lower voltage level, the clamp circuit 208 may be confronted with the overstress problem due to excessive cross voltage on the gate-to-bulk terminal.

After the switch connection in the clamp circuit 208 is ready for pull-low operation, the bulk configuration in the clamp circuit 208 may also be adjusted. The bulk control signals HBULK_P, HBULKB_P, HBULK_N and HBULKB_N received by the clamp circuit 208 may be switched to change the bulk voltage of the switches SW5-SW8. In this embodiment, the P-type bulk control signal HBULKB_P received by the PMOS transistors of the switches SW6 and SW8 changes its state to switch the bulk voltage of the PMOS transistors of the switches SW6 and SW8 (Step 708). The bulk voltage is switched from a higher voltage level (e.g., the power supply voltage VDDA) to the middle voltage VM. After the bulk voltage of the PMOS transistors is switched, the N-type bulk control signal HBULKB_N received by the NMOS transistors of the switches SW6 and SW8 changes its state to switch the bulk voltage of the NMOS transistors of the switches SW6 and SW8 (Step 710). The bulk voltage is switched from the middle voltage VM to a lower voltage level (e.g., the zero voltage).

Similarly, the order of switching the bulk voltage of PMOS transistors from a higher voltage to the middle voltage VM before switching the bulk voltage of the NMOS transistors from the middle voltage VM to a lower voltage aims at preventing the overstress problem caused by large cross voltage on the P-N junction between the adjacent P-well and N-well.

Figure 8D:
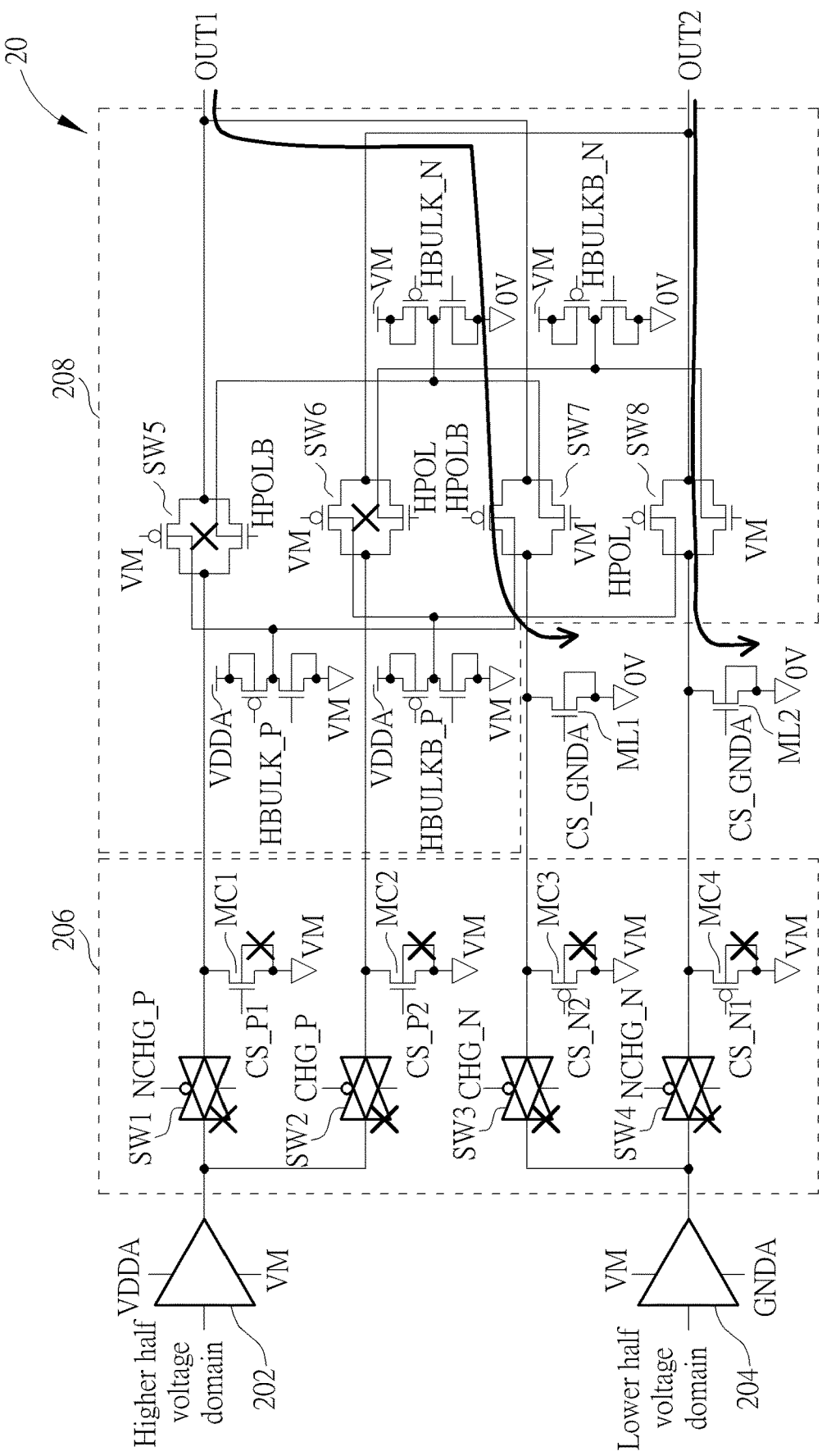

After the bulk switching is complete, the control signal CS_GNDA may turn on the pull-low transistors ML1 and ML2, to pull the output terminals OUT1 and OUT2 to the zero voltage or ground voltage (Step 712), as shown in FIG. 8D. Therefore, the power-off operations, from mid-voltage charge sharing to pull-low, may be complete, and the control signals in the output stage circuit 20 are well controlled and switched in a specific order to prevent the overstress problem. In addition, the control signal HPOL may be switched from the middle voltage VM to a lower voltage level such as 0V, so that the pull-low path is turned on completely. As can be seen, the power-off operation of the control process 70 may be considered as including steps inverse to the steps in the power-on operation of the control process 40.

Figure 9:
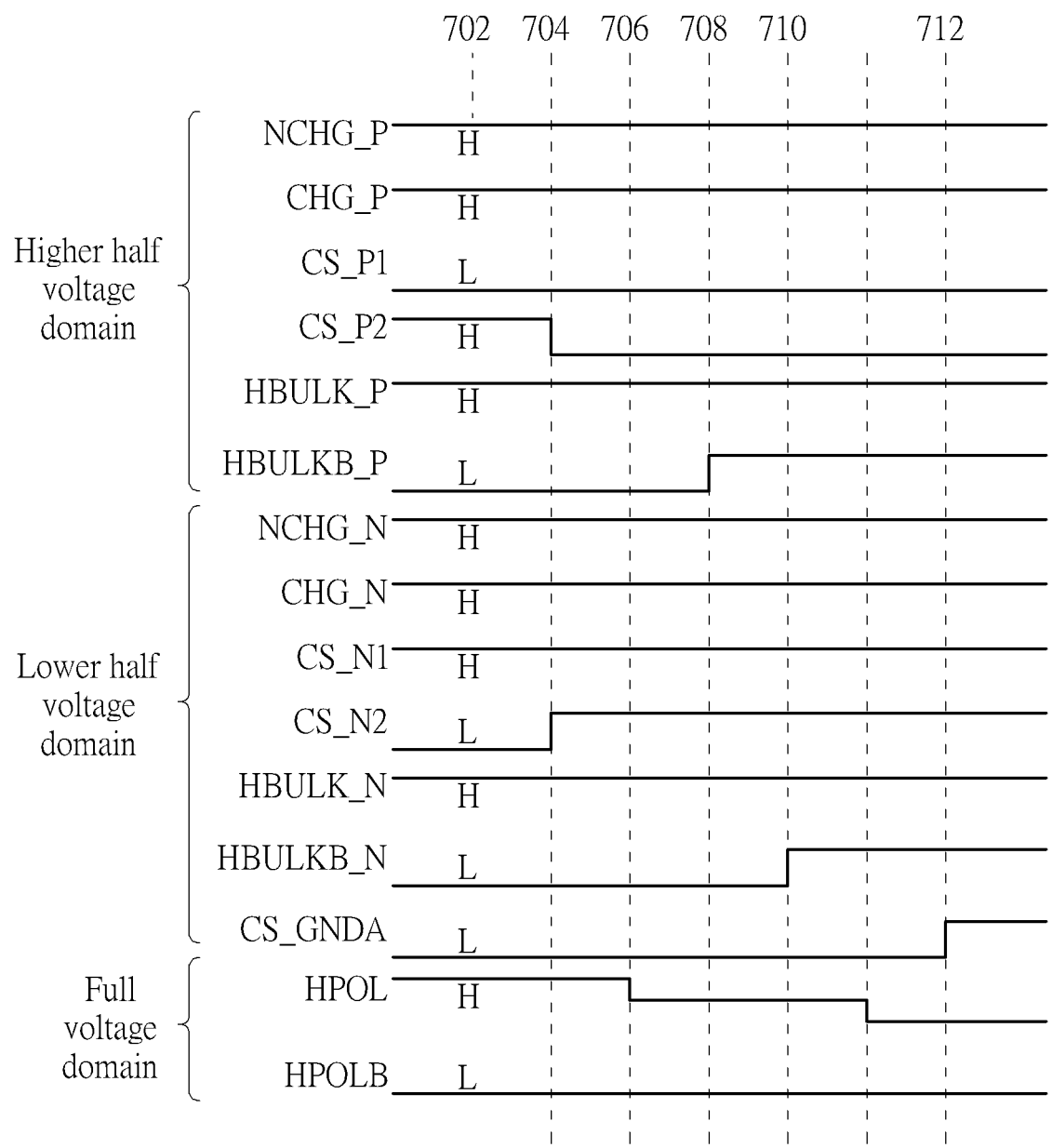
FIG. 9 is a waveform diagram of related control signals for the output stage circuit based on the control process shown in FIG.

FIG. 9 illustrates the waveforms of related control signals for the output stage circuit 20 based on the control process 70. Similarly, the control signals HPOL and HPOLB for the clamp circuit 208 are operated in the full voltage domain, and other control signals are operated in the higher half voltage domain or the lower half voltage domain. In an embodiment, the higher half voltage domain ranges from 5V to 10V, the lower half voltage domain ranges from 0V to 5V, and the full voltage domain ranges from 0V to 10V.

Please note that the present invention aims at providing an output stage circuit for a source driver and a method of controlling the output stage circuit to prevent the overstress problem. Those skilled in the art may make modifications and alternations accordingly. For example, in the output stage circuit of the present invention, a clamp circuit and pull-low transistors are included. These devices and transistors may be implemented with mid-voltage devices, of which the switching timing is well controlled to prevent occurrence of overstress. With proper timing control, the output stage circuit may realize the pull-low operation during power-on and power-off of the panel, and may also realize the polarity switching operation, where each output terminal may be configured to output voltage signals having positive polarity and negative polarity alternately, by switching the switches in the switch circuit 206 and the clamp circuit 208 in an appropriate order. In addition, the voltage values described in the embodiments of the present invention are merely served as examples for easy understanding. Those skilled in the art should understand that the operating voltage domain and the withstand voltage of the mid-voltage devices may have any feasible values. For example, a voltage signal corresponding to image data "0" outputted by the OP 204 may be slightly higher than the zero voltage, or the second half voltage domain may be in a negative voltage level.

Figure 10:
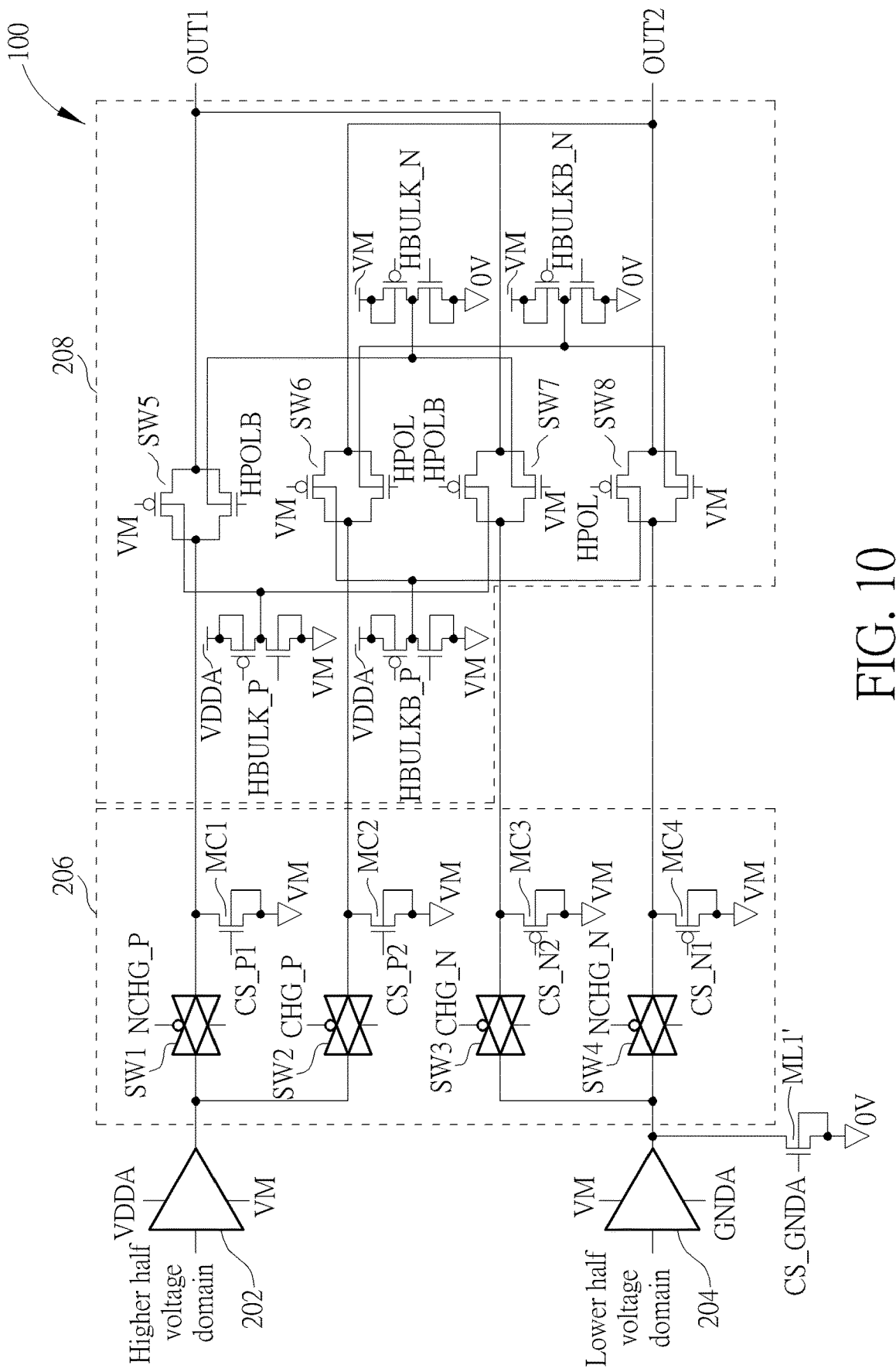
FIG. 10 is a schematic diagram of another output stage circuit according to an embodiment of the present invention.

In another embodiment, the pull-low transistor in the output stage circuit may be implemented in other manner. For example, please refer to FIG. 10, which is a schematic diagram of another output stage circuit 100 according to an embodiment of the present invention. The circuit structure of the output stage circuit 100 is similar to the circuit structure of the output stage circuit 20 shown in FIG. 3, so signals and elements having similar functions are denoted by the same symbols. As shown in FIG. 10, the difference between the output stage circuit 100 and the output stage circuit 20 is that, the output stage circuit 100 includes only one pull-low transistor ML1', which is coupled between the switch circuit 206 and the OP 204. In other words, in the output stage circuit 100, the pull-low transistor ML1' is disposed at the front end of the switch circuit 206 rather than the back end of the switch circuit 206. With this implementation, only one pull-low transistor ML1' is enough to pull low both output terminals OUT1 and OUT2. In this embodiment, when the control signal CS_GNDA turns on the pull-low transistor ML1', the OP 204 should be turned off or disabled, in order to prevent unnecessary leakage currents from the output terminal of the OP 204 flowing through the pull-low transistor ML1'.

No matter whether the pull-low transistor(s) is/are disposed at the front end or back end of the switch circuit, the pull-low transistor(s) is/are preferably disposed at the lower voltage side; that is, coupled to the OP in a lower voltage domain. For example, in the output stage circuit 100, if the OP 202 has an operating voltage range from 5V to 10V and the OP 204 has an operating voltage range from 0V to 5V, the pull-low transistor ML1' may be coupled to the OP 204 operated at a lower voltage domain than the other OP 202. As mentioned above, the pull-low transistor is configured to pull the output terminals to the zero voltage or ground voltage, and thus a terminal of the pull-low transistor is always coupled to a ground node. If the pull-low transistor is coupled to the OP in a higher voltage domain, the higher output voltage of the OP may easily generate an overstress voltage on the pull-low transistor, which easily causes the pull-low transistor to break down.

With the disposition of the pull-low transistor(s) and the clamp circuit, all circuit elements in the output stage circuit may be implemented with mid-voltage devices. Without the usage of high-voltage devices having a higher withstand voltage, the circuit area may be significantly reduced. The overstress problem of the mid-voltage devices may be solved by well controlling the switching of the switch circuit and the clamp circuit.

To sum up, the embodiments of the present invention provide an output stage circuit implemented with mid-voltage devices, so as to prevent large circuit area and high turned-on resistance caused by high-voltage devices. The overstress problem of the mid-voltage devices may be solved by using a well timing control scheme. The output stage circuit includes a clamp circuit, which limits the cross voltage with a switching bulk scheme, where the PMOS bulk voltage and the NMOS bulk voltage are switched in a proper manner to prevent occurrence of overstress. The output stage circuit further includes at least one pull-low transistor, which may pull the output terminals of the output stage circuit to the zero voltage during power-on and power-off operations of the panel, so as to prevent unwanted flicker appearing on the screen. The switching timing of the switches and transistors in the output stage circuit may be well controlled to perform the power-on and power-off operations while protecting the mid-voltage devices from the overstress problem.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An output stage circuit of a source driver, comprising:
   a first operational amplifier, operated in a first voltage domain;
   a second operational amplifier, operated in a second voltage domain;
   a switch circuit, coupled to the first operational amplifier and the second operational amplifier;
   a clamp circuit, coupled between the switch circuit and a plurality of output terminals of the output stage circuit; and
   at least one pull-low transistor, coupled to the switch circuit
   wherein transistors in the clamp circuit have the same withstand voltage as transistors in the switch circuit and transistors in the first operational amplifier and the second operational amplifier.

2. The output stage circuit of claim 1, wherein the at least one pull-low transistor is coupled between the switch circuit and the clamp circuit.

3. The output stage circuit of claim 1, wherein the at least one pull-low transistor is coupled between the switch circuit and one of the first operational amplifier and the second operational amplifier.

4. The output stage circuit of claim 1, wherein the at least one pull-low transistor is coupled to the second operational amplifier which is operated in the second voltage domain lower than the first voltage domain.

5. The output stage circuit of claim 1, wherein the at least one pull-low transistor is configured to pull the plurality of output terminals of the output stage circuit to a first voltage.

6. The output stage circuit of claim 5, wherein the first voltage is a ground voltage.

7. The output stage circuit of claim 5, wherein the switch circuit comprises a plurality of charge sharing transistors configured to pull the plurality of output terminals of the output stage circuit to a second voltage.

8. The output stage circuit of claim 7, wherein the second voltage is between the first voltage domain and the second voltage domain.

9. The output stage circuit of claim 1, wherein the clamp circuit receives a bulk control signal for switching a bulk voltage of the clamp circuit.

10. A method of controlling an output stage circuit, the output stage circuit comprising a plurality of output terminals, a first operational amplifier operated in a first voltage domain, a second operational amplifier operated in a second voltage domain, a switch circuit, a clamp circuit, and at least one pull-low transistor, the method comprising:
    pulling, by the at least one pull-low transistor, the plurality of output terminals to a first voltage;
    turning off the at least one pull-low transistor;
    adjusting a switch connection in the clamp circuit;
    receiving, by the clamp circuit, a bulk control signal for switching a bulk voltage of the clamp circuit; and
    turning on a plurality of charge sharing transistors in the switch circuit to pull the plurality of output terminals to a second voltage different from the first voltage;
    wherein the step of adjusting the switch connection in the clamp circuit comprises:
      turning on a plurality of first switches in the clamp circuit coupled to the plurality of charge sharing transistors, and turning off a second switch in the clamp circuit coupled to the at least one pull-low transistor.

11. The method of claim 10, wherein the first voltage is a ground voltage, and the second voltage is between the first voltage domain and the second voltage domain.

12. The method of claim 10, wherein the step of receiving, by the clamp circuit, the bulk control signal for switching the bulk voltage of the clamp circuit comprises:
    receiving, by an N-type metal oxide semiconductor (NMOS) transistor in the clamp circuit, an N-type bulk control signal for switching the bulk voltage of the NMOS transistor; and
    receiving, by a P-type metal oxide semiconductor (PMOS) transistor in the clamp circuit, a P-type bulk control signal for switching the bulk voltage of the PMOS transistor after the bulk voltage of the NMOS transistor is switched.

13. The method of claim 12, wherein the bulk voltage of the NMOS transistor is switched from a low voltage to a middle voltage, and the bulk voltage of the PMOS transistor is switched from the middle voltage to a high voltage.

14. A method of controlling an output stage circuit, the output stage circuit comprising a plurality of output terminals, a first operational amplifier operated in a first voltage domain, a second operational amplifier operated in a second voltage domain, a switch circuit, a clamp circuit, and at least one pull-low transistor, the method comprising:
    pulling, by a plurality of charge sharing transistors in the switch circuit, the plurality of output terminals to a first voltage;
    turning off the plurality of charge sharing transistors;
    adjusting a switch connection in the clamp circuit;
    receiving, by the clamp circuit, a bulk control signal for switching a bulk voltage of the clamp circuit; and
    turning on the at least one pull-low transistor to pull the plurality of output terminals to a second voltage different from the first voltage.

15. The method of claim 14, wherein the first voltage is between the first voltage domain and the second voltage domain, and the second voltage is a ground voltage.

16. The method of claim 14, wherein the step of adjusting the switch connection in the clamp circuit comprises:
    turning on a first switch in the clamp circuit coupled to the at least one pull-low transistor, and turning off a second switch in the clamp circuit coupled to one of the plurality of charge sharing transistors.

17. The method of claim 14, wherein the step of receiving, by the clamp circuit, the bulk control signal for switching the bulk voltage of the clamp circuit comprises:
    receiving, by a P-type metal oxide semiconductor (PMOS) transistor in the clamp circuit, a P-type bulk control signal for switching the bulk voltage of the PMOS transistor; and
    receiving, by an N-type metal oxide semiconductor (NMOS) transistor in the clamp circuit, an N-type bulk control signal for switching the bulk voltage of the NMOS transistor after the bulk voltage of the PMOS transistor is switched.

18. The method of claim 17, wherein the bulk voltage of the PMOS transistor is switched from a high voltage to a middle voltage, and the bulk voltage of the NMOS transistor is switched from the middle voltage to a low voltage.

* * * * *